United States Patent [19]

Tanizaki

[11] Patent Number: 5,349,562
[45] Date of Patent: Sep. 20, 1994

[54] DYNAMIC RANDOM ACCESS MEMORY DEVICE SUITABLE FOR SHORTENING TIME REQUIRED FOR TESTING SELF-REFRESH FUNCTION

[75] Inventor: Tetsushi Tanizaki, Hyogo, Japan

[73] Assignee: Mitsubishi Denki Kabushiki Kaisha, Tokyo, Japan

[21] Appl. No.: 45,572

[22] Filed: Apr. 9, 1993

[30] Foreign Application Priority Data

Jun. 4, 1992 [JP] Japan ................................. 4-144044

[51] Int. Cl.$^5$ .............................................. G11C 7/00
[52] U.S. Cl. ..................................... 365/222; 365/201
[58] Field of Search ............... 365/222, 201; 371/10.1, 371/10.2, 10.3, 21.1

[56] References Cited

U.S. PATENT DOCUMENTS

| | | | |
|---|---|---|---|
| 4,716,551 | 12/1987 | Inagaki | 365/222 |
| 4,933,907 | 6/1990 | Kumanoya et al. | |
| 4,935,900 | 6/1990 | Ohsawa | 365/201 |
| 5,243,576 | 9/1993 | Ishikawa | 365/222 |

OTHER PUBLICATIONS

Digest of Technical Papers of IEEE International Solid-State Circuits Conference, Feb. 15, 1985, pp. 252-253.

*Primary Examiner*—Eugene R. LaRoche
*Assistant Examiner*—Vu Le
*Attorney, Agent, or Firm*—Lowe, Price, LeBlanc & Becker

[57] ABSTRACT

A dynamic random access memory (DRAM) having an improved refresh control circuit (20) is disclosed. A self-refresh control circuit (15) includes an oscillating circuit (13) for generating a clock signal ($\phi 0$) defining a refresh cycle in a normal self-refresh mode, and an oscillating circuit (16) for generating a clock signal ($\phi t$) defining a refresh cycle in a test mode. When a high voltage higher than a level of a power supply voltage Vcc is applied to a RAS input terminal (22), a test mode detecting circuit (19) provides a high level signal (CTE), thereby turning on a transmission gate (18). In a self-refresh function verification test, since a refresh counter can generate a refresh address having a refresh cycle shorter than in the normal self-refresh mode, time required for carrying out the test may be shortened.

11 Claims, 8 Drawing Sheets

DYNAMIC RANDOM ACCESS MEMORY DEVICE SUITABLE FOR SHORTENING TIME REQUIRED FOR TESTING SELF-REFRESH FUNCTION

BACKGROUND OF THE INVENTION

1. Field of the Invention

The present invention generally relates to dynamic random access memory devices, and more particularly, to an improvement for shortening time for a test of a dynamic random access memory device having a self-refresh function.

2. Description of the Background Art

A dynamic random access memory (hereinafter referred to as a "DRAM") is widespread as a semiconductor memory suitable for high integration in a semiconductor substrate, since one memory cell is constituted of one switching transistor and one data storage capacitor. In a DRAM, it is necessary to carry out a "refresh operation" which periodically amplifies a data signal stored in a capacitor, since the data signal is retained by the capacitor. Most of DRAMs in recent years have a function (generally referred to a "self-refresh function") which may carry out a refresh operation without requiring internal or external refresh control. An example of a DRAM having a self-refresh function is disclosed in U.S. Pat. No. 4,933,907 issued to the same applicant as the present application.

FIG. 5 is a block diagram of a DRAM showing the background of the present invention. Referring to FIG. 5, a DRAM 100 includes a memory cell array 1 having 4,718,592 memory cells arranged in rows and columns, a row decoder 2 for selecting a word line in the memory cell array 1, a column decoder 3 for selecting a memory cell column to be accessed, an address buffer 4 for receiving an address signal externally applied in a time sharing manner, a sense refresh amplifier 5 connected to the memory cell array 1, and an IO gate circuit 6 for selectively connecting a bit line in the memory cell array 1 and an input buffer 7 and an output buffer 8. In FIG. 5, a line 100 also shows a semiconductor substrate.

A clock signal generator 9 generates various clock signals for controlling circuits in the DRAM 100 in response to an externally applied row address strobe signal /RAS and a column address strobe signal /CAS. A refresh control circuit 10 operates in response to a RAS and CAS system internal signal Sr applied from the clock signal generator 9, and generates a refresh control signal REF.

In the write operation, externally applied data signals DQ0 to DQ8 are applied to the 10 gate circuit 6 through the input buffer 7. The column decoder 3 selectively renders one switching circuit (not shown) in the IO gate circuit 6 conductive by decoding column address signals CA0 to CA8 applied through the address buffer 4. Therefore, a data signal is applied to a bit line (not shown) in the memory cell array 1. The row decoder 2 decodes row address signals RA0 to RA9 applied through the address buffer 4 to selectively activate one word line, not shown. Therefore, the data signal on the bit line is written to a memory cell (not shown) designated by the row decoder 2 and the column decoder 3.

In the read operation, a stored data signal is applied on a bit line (not shown) from a memory cell designated by the row decoder 2. The data signal on the bit line is amplified by the sense refresh amplifier 5. Since the column decoder 3 selectively renders one switching circuit (not shown) in the IO gate circuit 6 conductive, the amplified data signal is applied to the output buffer 8. Therefore, the data stored in the memory cell array 1 are provided outside through the output buffer 8.

FIG. 6 is a schematic diagram showing part of a conventional bit line peripheral circuit. FIG. 7 is a timing chart for explaining operations shown in FIG. 6. Description on the bit line peripheral circuit shown in FIG. 6 is given in *Digest of Technical Papers* of International Solid-State Circuits Conference held in 1985 (ISSCC85) pp. 252–253.

Referring to FIGS. 6 and 7, when a word line WLi is activated in the read operation, a switching transistor Qs of a memory cell MC is turned on. Therefore, a data signal stored in a capacitor Cs in the memory cell MC appears on a bit line BLj. Since the sense amplifier 5 constituted of transistors Q1 to Q4 is activated in response to activation control signals $S_P$ and $S_N$, a subtle potential difference which appears between bit lines BLj and /BLj is amplified by the sense amplifier 5. Since a high level column selecting signal Yj is applied to the gates of transistors Q8 and Q9 from the column decoder 3, transistors Q8 and Q9 are turned on. Therefore, the data signal amplified by the sense amplifier 5 is applied to an IO line pair 6a, 6b. A data signal on the IO line pair 6a, 6b is transmitted to the output buffer 8.

Although the above description was given of the general read operation, it is pointed out that the similar operation is carried out in the refresh operation. However, since the high level column selecting signal Yj is not applied in the refresh operation, transistors Q8 and Q9 are not turned on. The data signal amplified by the sense amplifier 5 is applied again to the capacitor Cs through a conductive switching transistor Qs. In other words, although a signal electrical charge retained by the capacitor Cs is gradually reduced in accordance with time, the signal electrical charge is regained by periodical amplification and rewrite by the sense amplifier 5. The refresh operation in the DRAM is carried out in a detailed circuit in the above-described manner.

FIG. 8 is a circuit block diagram of a refresh control circuit 10 shown in FIG. 5. Referring to FIG. 8, the refresh control circuit 10 includes a CAS before RAS (hereinafter referred to as "CBR") refresh control circuit 11, and a self-refresh control circuit 12. A CBR refresh operation is carried out in response to a fall timing of externally applied signals /RAS and /CAS. In other words, the CBR refresh operation is carried out under external control. The CBR refresh control circuit 11 provides a refresh control signal REF for CBR refresh to the address buffer 4 in response to the RAS and CAS system internal signal Sr applied from the clock signal generator 9 shown in FIG. 5.

The self-refresh control circuit 12 includes an oscillating circuit 13 constituted of a ring oscillator, not shown, and a self-refresh cycle setting counter (hereinafter referred to as a "self-refresh counter") 14 for counting clock signals $\phi 0$ applied from the oscillating circuit 13. When the CBR refresh operation is not requested externally, a signal Ssr for requesting the self-refresh operation is automatically generated from the CBR refresh control circuit 11 to be provided to the self-refresh control circuit 12. The self-refresh counter 14 counts clock signals $\phi 0$ provided from the oscillating circuit 13 to apply the refresh control signal REF to the address buffer 4.

The oscillating circuit 13 starts oscillation in response to a self-refresh request signal Ssr, and provides clock signals φ0 having a cycle pulse of several μs to ten and several μs. The self-refresh counter 14 counts the clock signals φ0, and provides the refresh control signal REF including a cycle pulse of a hundred and several tens μs.

A circulation cycle of the refresh control signal REF applied to the address buffer 4 in a self-refresh mode is set to as long a time length as possible within the range where a data signal stored in the memory cell is not lost. The reason is that it is necessary to make a refresh interval as long as possible to reduce the power consumption since the refresh operation involves activation of the sense amplifier. Therefore, taking into consideration data storage capability and power consumption of a DRAM, a ring oscillator having a long cycle is used in the oscillating circuit 13 provided in the self-refresh control circuit 12.

Generally, various tests are carried out before shipping products in semiconductor manufacturing factories. As for a DRAM, although various tests are carried out, it is pointed out that there are following problems particularly in a DRAM having a self-refresh function. As described above, since the oscillating circuit 13 provides a clock signal φ0 having a relatively long cycle, it takes long time to verify that the self-refresh function is normally carried out in the DRAM. In other words, in a self-refresh function verification test, it is verified that data signals stored in all memory cells continue to be retained properly by the self-refresh operation. Since the oscillating circuit 13 provides the clock signal φ0 of a relatively long cycle, the circulation cycle of the refresh control REF provided from the self-refresh counter 14 is also long. Therefore, it required long time for the row decoder 2 to designate all memory cell rows in accordance with the refresh control REF, whereby the entire time required for the self-refresh function verification test was increased.

SUMMARY OF THE INVENTION

One object of the present invention is to shorten time required for carrying out a self-refresh function verification test of a dynamic random access memory device.

Another object of the present invention is to shorten time required for testing a refresh counter for self-refresh in a dynamic random access memory device.

Briefly, the dynamic random access memory device according to the present invention includes a memory cell array having a plurality of memory cells arranged in rows and columns, a refresh address generating circuit for generating a refresh address signal in response to an applied clock signal, a designating circuit for designating a memory cell to be refreshed in the memory cell array in response to the refresh address signal, a first clock signal generator for generating a first clock signal having a first frequency defining a refresh cycle in a normal self-refresh mode, a second clock signal generator for generating a second clock signal having a second frequency higher than the first frequency, and a selective supply circuit for selectively supplying one of the first and the second clock signals to the refresh address generating circuit in response to an externally applied test mode signal.

In the operation, when a test mode is designated externally, the second clock signal having the second frequency higher than the first frequency in the normal self-refresh mode is applied to the refresh address generating circuit. Therefore, in the test mode, since the refresh address generating circuit generates a refresh address having a circulation cycle shorter than in the normal self-refresh mode, it is possible to shorten time required for the self-refresh function verification test.

According to another aspect of the present invention, the dynamic random access memory device includes a memory cell array having a plurality of memory cells arranged in rows and columns, a refresh address generating circuit for generating a refresh address signal in response to an applied clock signal, a designating circuit for designating a memory cell to be refreshed in the memory cell array in response to the refresh address signal, a first clock signal generator for generating a first clock signal having a first frequency defining a refresh cycle in a normal self-refresh mode, a terminal for receiving an externally applied second clock signal having a second frequency higher than the first frequency, and a selective supply circuit for selectively supplying one of the first and the second clock signals to the refresh address generating circuit in response to an externally applied test mode signal.

According to still another aspect of the present invention, the dynamic random access memory device includes a memory cell array having a plurality of memory cells arranged in rows and columns, a refresh counter for generating a refresh address signal by counting applied clock signals, an address decoder for designating a memory cell to be refreshed in the memory cell array by decoding the refresh address signal, a first clock signal generator for generating and applying to the refresh counter a first clock signal having a first frequency defining a refresh cycle in a normal self-refresh mode, and a frequency changing circuit for changing a frequency of the clock signal applied to the refresh counter to a higher one in response to an externally applied test mode signal.

In the operation in the test mode, the frequency of the clock signal applied to the refresh counter is changed to a higher one by the frequency changing circuit. Therefore, since the refresh counter provides a refresh address signal having a circulation cycle shorter than in the normal self-refresh mode, time required for the refresh function verification test may be shortened.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
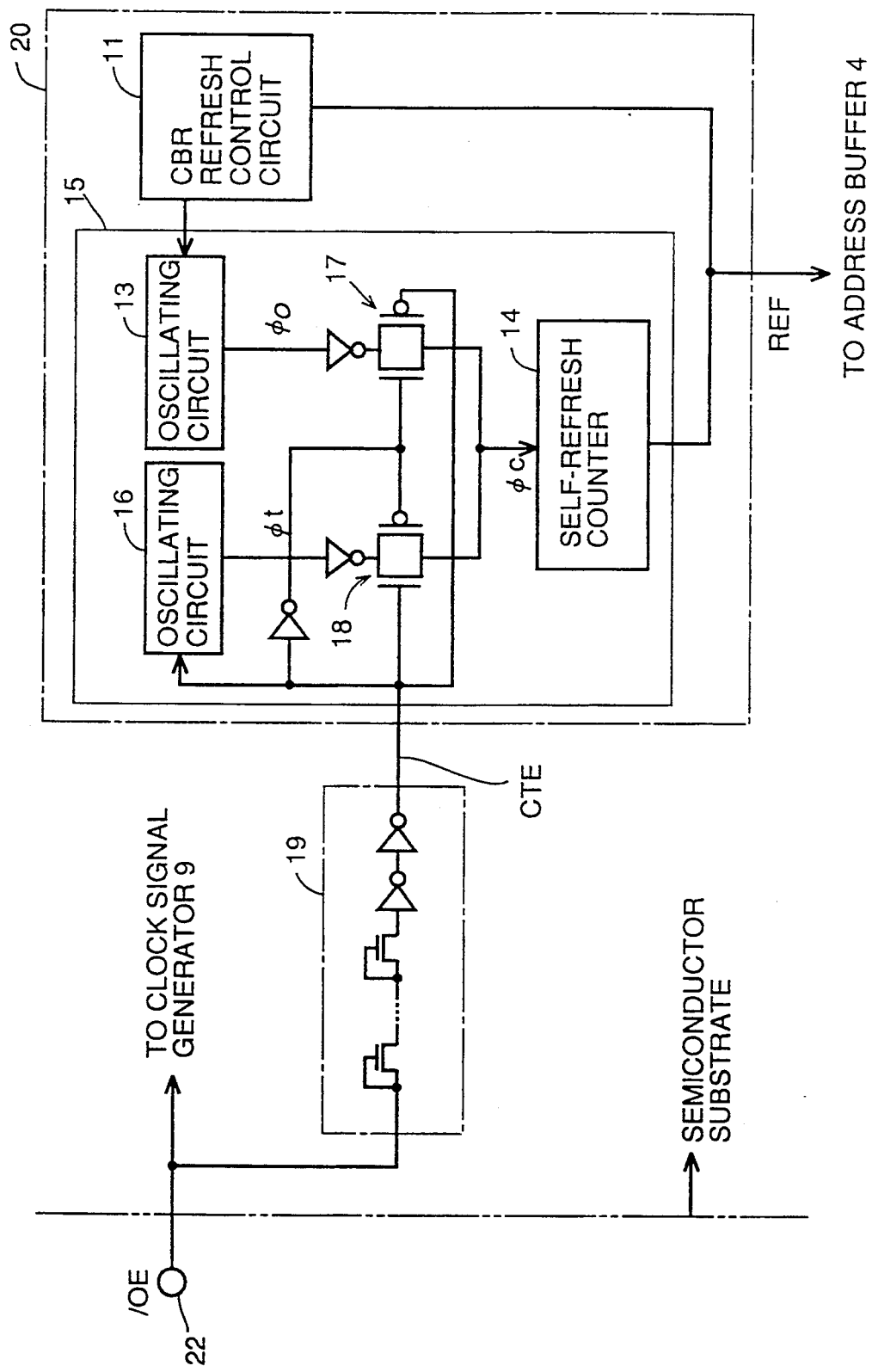
FIG. 1 is a circuit block diagram of a refresh control circuit showing one embodiment of the present invention.

Referring to FIG. 1, a refresh control circuit 20 includes a CBR control circuit 11 and an improved self-refresh control circuit 15. The self-refresh control circuit 15 includes an oscillating circuit 13 for generating a clock signal $\phi 0$ defining a refresh cycle in a normal self-refresh operation, an oscillating circuit 16 for generating a clock signal $\phi t$ defining a refresh cycle in an externally designated test mode, and transmission gates 17 and 18 connected to outputs of oscillating circuits 13 and 16, respectively.

A test mode detecting circuit 19 is connected to an input terminal 22 for receiving an output enable signal /OE externally. The two transmission gates 17 and 18 provided in the refresh control circuit 20 are selectively rendered conductive in response to a test mode signal CTE applied from the test mode detecting circuit 19. Therefore, one of two clock signals $\phi 0$ and $\phi t$ generated from oscillating circuits 13 and 16 is selectively applied to the self-refresh counter 14 as a counter driving signal $\phi c$.

In the normal self-refresh mode, the IOE signal may be received by the input terminal 22. Since the CBR refresh control circuit 11 automatically provides a signal Ssr requesting the self-refresh operation, the normal self-refresh operation is started. The test mode detecting circuit 19 provides a low level test mode signal CTE at this time, since it is constituted of a high voltage detecting circuit. Therefore, transmission gates 17 and 18 are turned on and off, respectively, in response to the test mode signal CTE. Therefore, in the normal self-refresh mode, the clock signal $\phi 0$ provided from the oscillating circuit 13, that is, a clock signal having a relatively long cycle is applied to the self-refresh counter 14 as a signal $\phi c$. The self-refresh counter 14 provides the refresh control signal REF having a refresh cycle (that is, a circulation cycle) defined by the clock signal $\phi c$.

When the self-refresh function verification test is carried out, a test mode designating signal having a higher voltage level exceeding a power supply voltage Vcc is applied to the terminal 22. The test mode detecting circuit, that is, the high voltage detecting circuit 19 provides the high level test mode signal CTE in response to a high voltage applied to the terminal 22. Transmission gates 17 and 18 are turned on and off, respectively, in response to the signal CTE. Therefore, the clock signal $\phi t$ having a higher frequency generated from the oscillating circuit 16 is applied to the self-refresh counter 14 through the transmission gate 18 as a signal $\phi c$. As a result, the self-refresh counter 14 can generate the refresh control signal REF having a refresh cycle (that is, a circulation cycle) shorter than in the normal self-refresh mode.

Figure 5:
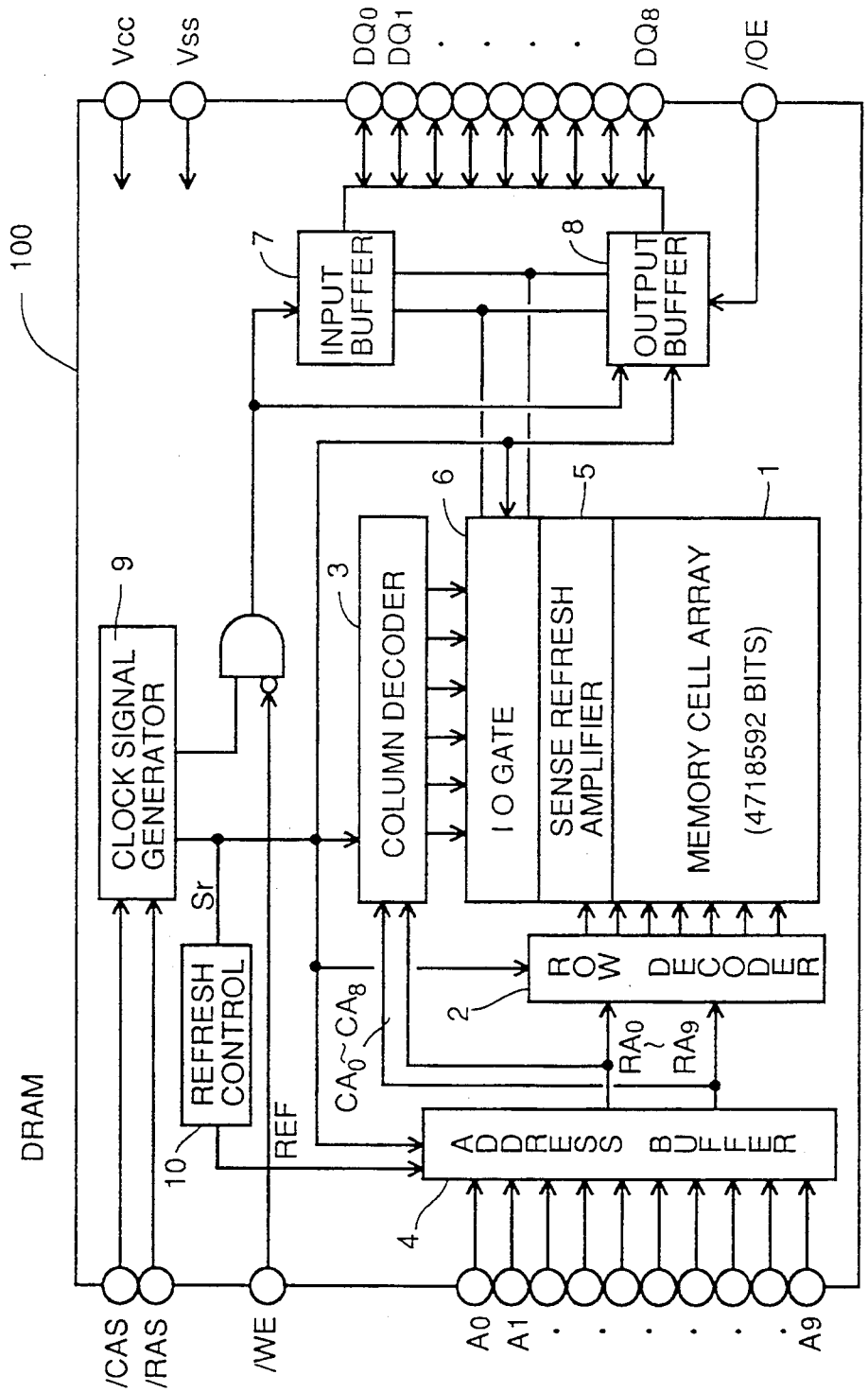
FIG. 5 is a block diagram of a DRAM showing the background of the present invention.
Figure 6:
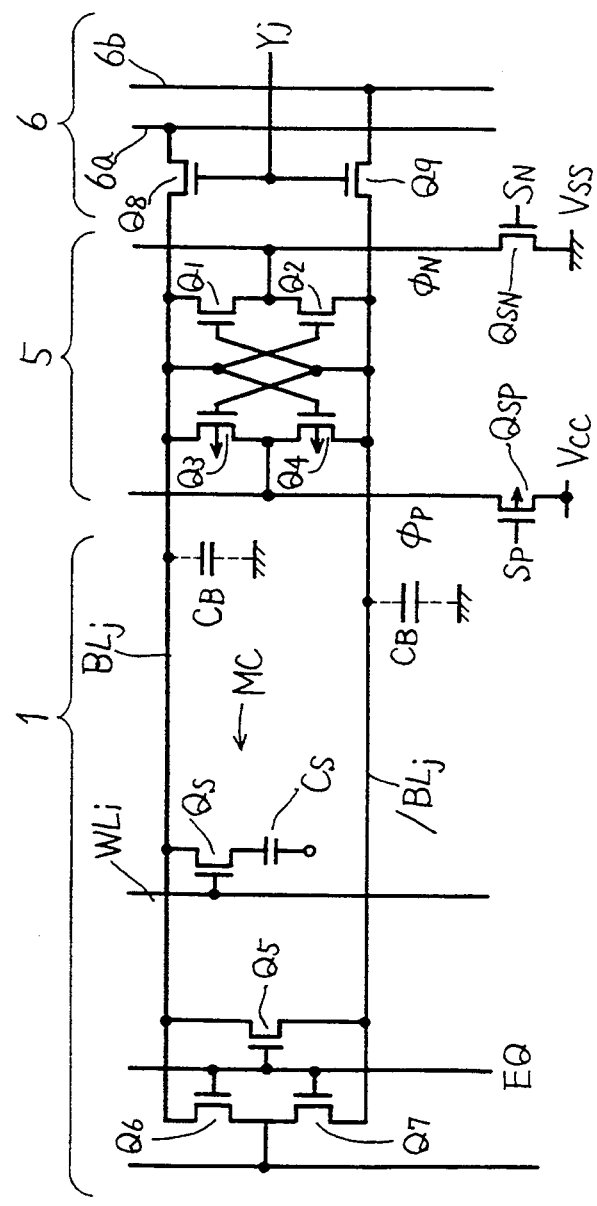
FIG. 6 is a schematic diagram of a circuit showing part of a conventional bit line peripheral circuit.
Figure 7:
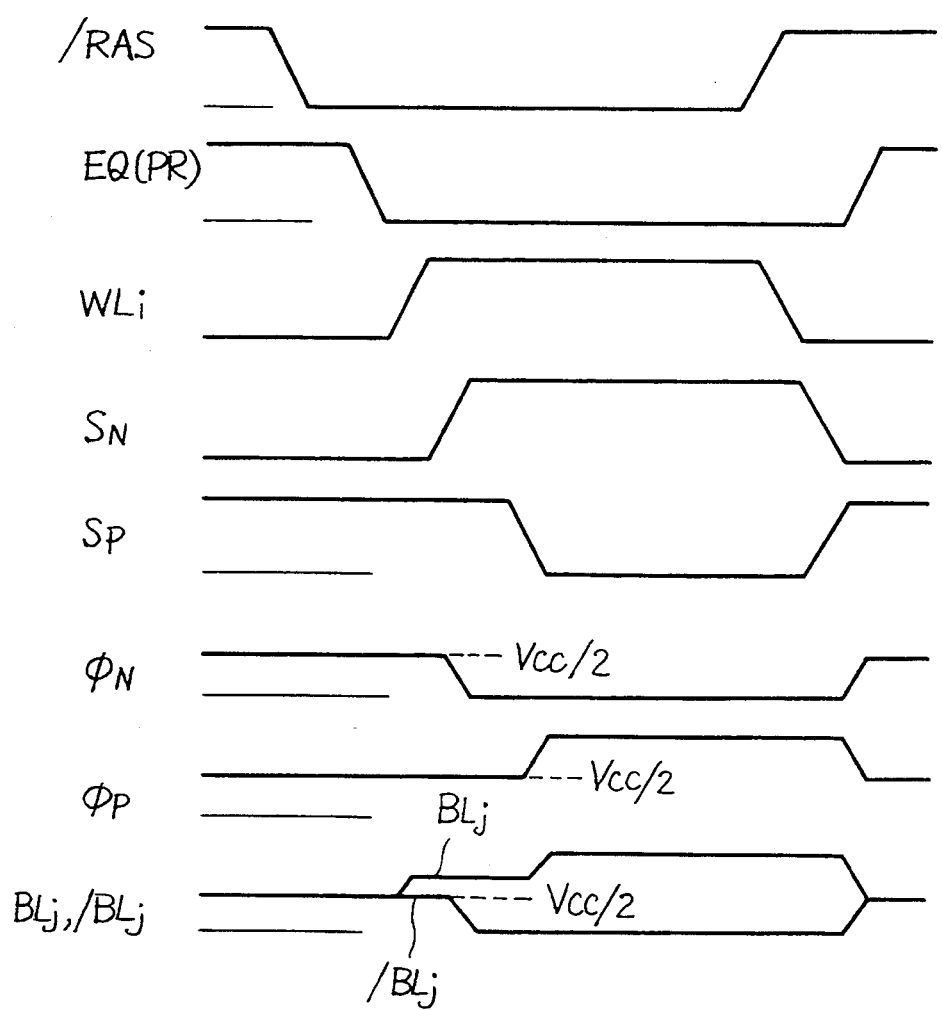
FIG. 7 is a timing chart for explaining operations of the circuit shown in FIG. 6.

The refresh control signal REF having a shorter refresh cycle is applied to the address buffer 4 shown in FIG. 5, whereby the row decoder 2 can designate all memory cell rows in the memory cell array 1 in a time shorter than in the normal self-refresh mode in the self-refresh function verification test. Therefore, it is possible to verify the normal operation of the self-refresh counter 14 in a shorter time, and it is further possible to shorten the time required for the self-refresh function verification test.

Figure 8:
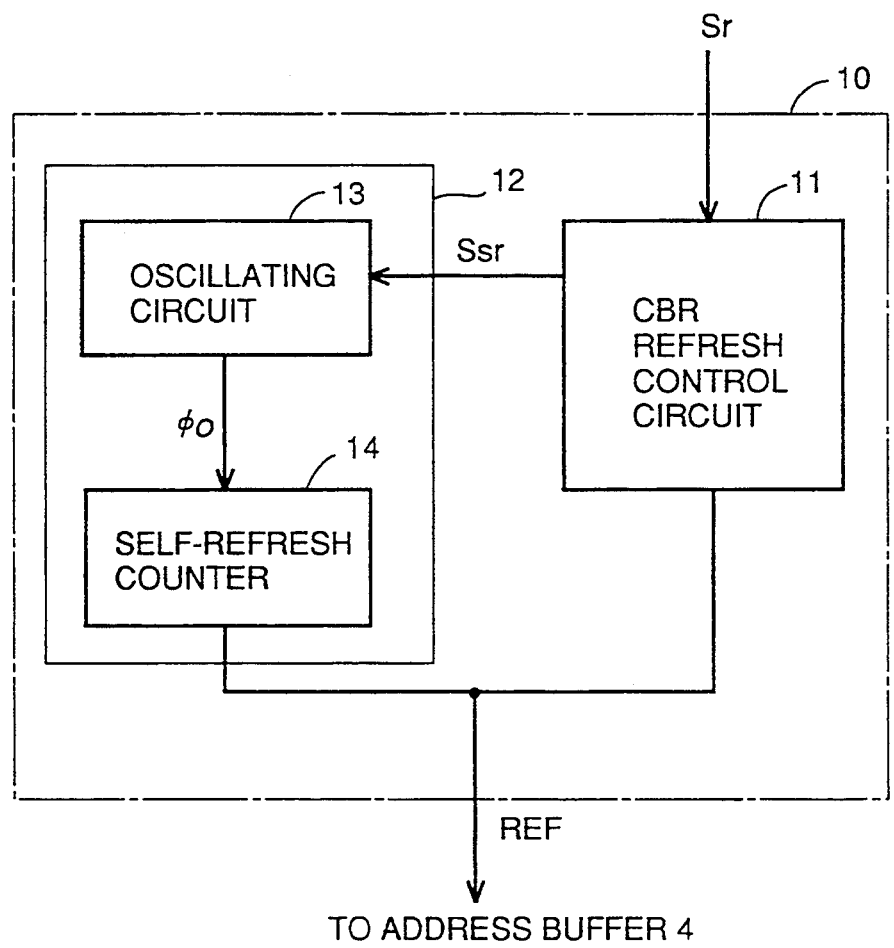
FIG. 8 is a circuit block diagram of the refresh control circuit shown in FIG. 5.

On the other hand, when the CBR refresh operation is requested externally, the refresh control signal REF is provided from the CBR refresh control circuit 11, similarly to the case of the refresh control circuit 10 shown in FIG. 8.

Figure 2:
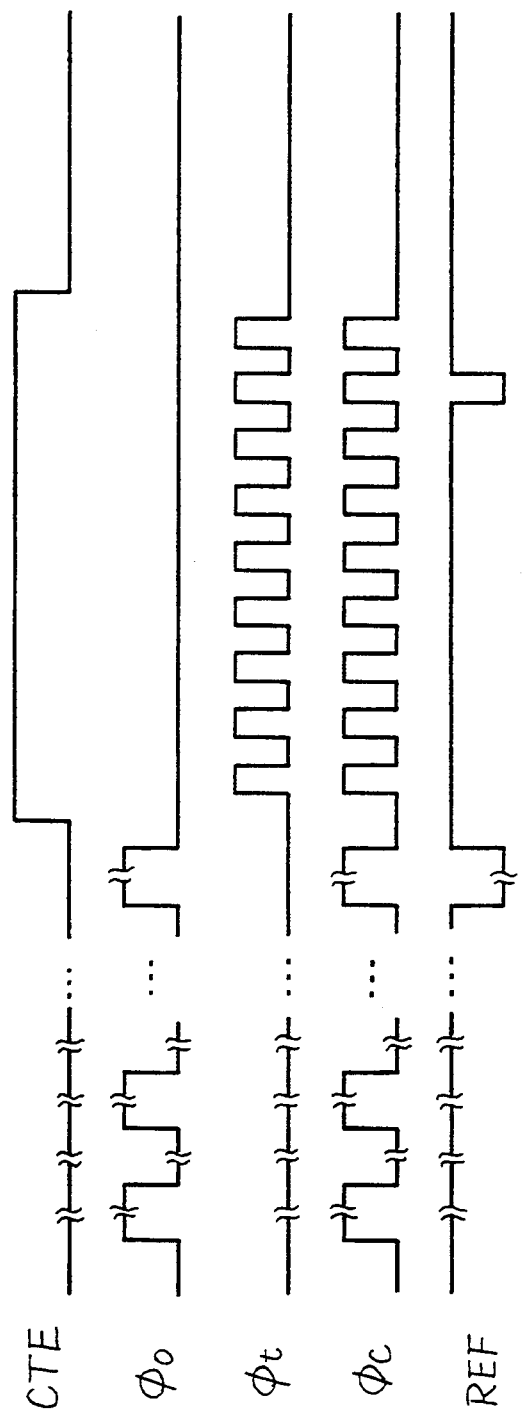
FIG. 2 is a timing chart for explaining operation of the circuit shown in FIG. 1.

FIG. 2 is a timing chart for explaining operation of the refresh control circuit 20 shown in FIG. 1. The above-described operation of the refresh control circuit 20 is shown in the timing chart of FIG. 2. More specifically, when the test mode is not designated externally, a low level test mode signal CTE is provided from the test mode detecting circuit 19. Therefore, the clock signal $\phi 0$ generated from the oscillating circuit 13 is applied to the self-refresh counter 14 through the transmission gate 17 as a driving signal $\phi c$. On the other hand, when the test mode is designated externally, the test mode detecting circuit 19 provides a high level test mode signal CTE. Therefore, the clock signal $\phi t$ generated from the oscillating circuit 16 is provided to the self-refresh counter 14 through the transmission gate 18 as a driving signal $\phi c$.

Figure 3:
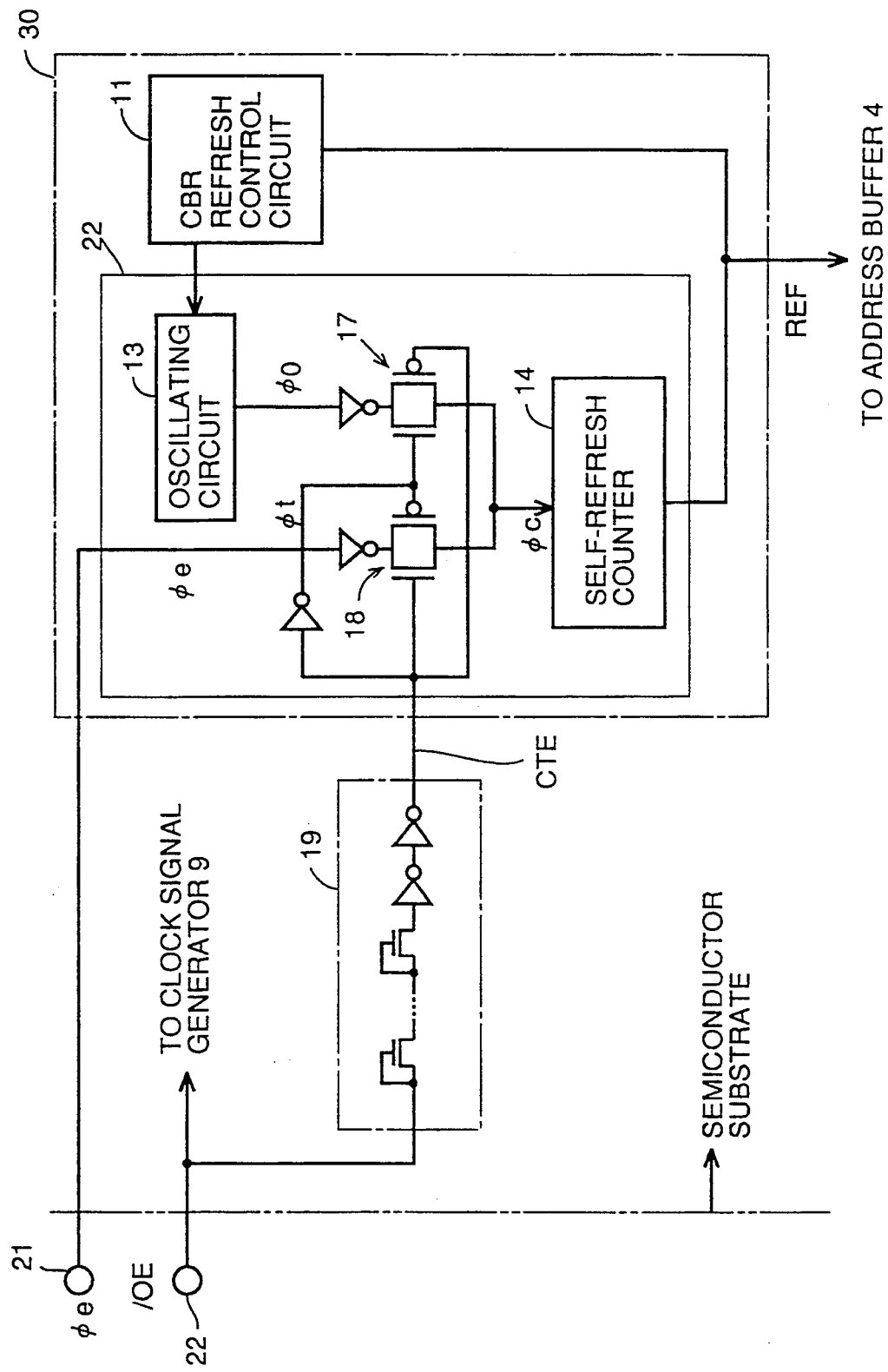
FIG. 3 is a circuit block diagram of a refresh control circuit showing another embodiment of the present invention.

FIG. 3 is a circuit block diagram of the refresh control circuit showing another embodiment of the present invention. Referring to FIG. 3, compared to the circuit 20 shown in FIG. 1, a refresh control circuit 30 does not include the oscillating circuit 16. More specifically, a self-refresh control circuit 22 is connected to receive an externally applied clock signal $\phi e$ in place of the oscillating circuit 16 shown in FIG. 1. The other circuit configurations shown in FIG. 1 are substantially the same as those shown in FIG. 1, and description will not be repeated.

Figure 4:
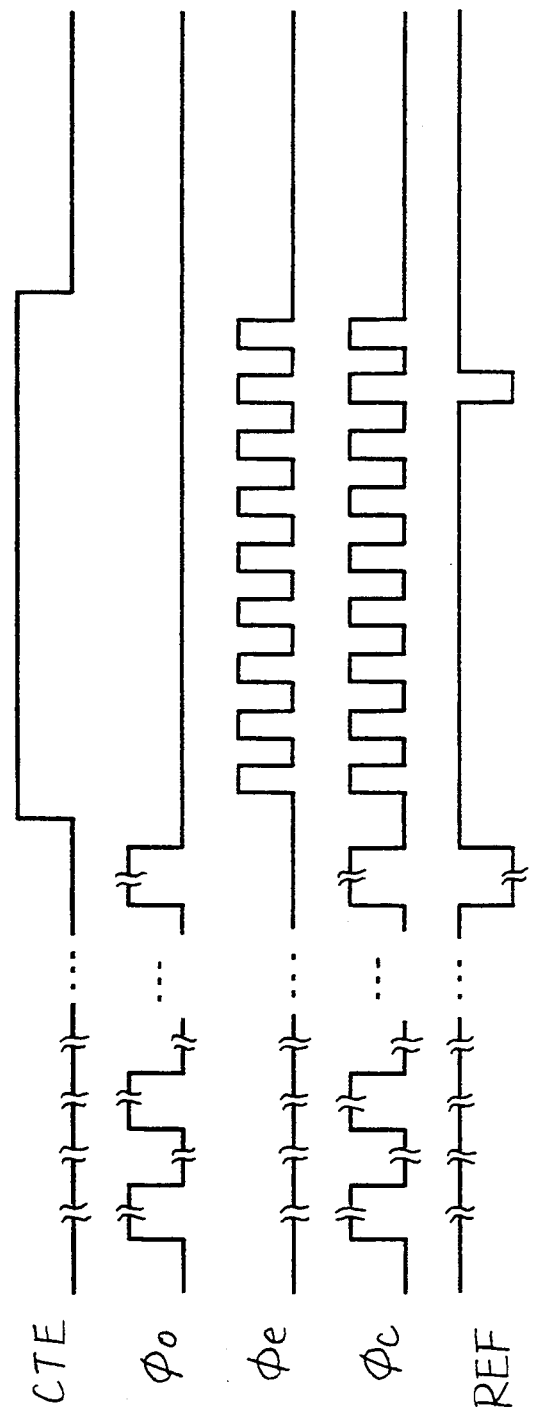
FIG. 4 is a timing chart for explaining operations of the circuit shown in FIG. 3.

The external clock signal $\phi e$ is applied through a spare input terminal 21. The clock signal $\phi e$ has a frequency higher than that of the clock signal $\phi 0$ in order to shorten time required for the self-refresh function verification test. Therefore, also in the embodiment shown in FIG. 3, when the test mode is designated externally, the external clock signal $\phi e$ is applied to the self-refresh counter 14 through the transmission gate 18. As a result, similarly to the example of the circuit 20 shown in FIG. 1, the time required for the self-refresh function verification test may be shortened. A timing chart for explaining operation of the circuit shown in FIG. 3 is shown in FIG. 4.

As described above, by applying the refresh control circuits 20 or 30 and the test mode detecting circuit 19 shown in FIGS. 1 and 3 to the DRAM shown in FIG. 5, it is possible to apply the refresh control REF having a shorter refresh cycle or circulation cycle to the address buffer 4 in the self-refresh function verification test. As a result, since all memory cell rows in the memory cell array 1 may be designated in a shorter time by the row decoder 2, it is possible to verify the normal operation of the self-refresh counter 14 in a shorter time, resulting in completion of the self-refresh function verification test in a shorter time. Although, when the spare input terminal 21 is left in the DRAM, the refresh control circuit 30 shown in FIG. 3 is used, the refresh control circuit 20 shown in FIG. 1 may be used even if such terminal 21 is not left. This means the time for the test can be shortened without increasing input terminals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device having a self-refresh function, comprising:

a memory cell array having a plurality of memory cells arranged in rows and columns;

refresh address generating means responsive to an applied clock signal for generating a refresh address signal;

designating means responsive to the refresh address signal for designating a memory cell to be refreshed in said memory cell array;

first clock signal generating means for generating a first clock signal having a first frequency defining a refresh cycle in a normal self-refresh mode;

second clock signal generating means for generating a second clock signal having a second frequency higher than said first frequency; and selective supply means responsive to an externally applied test mode signal for selectively supplying one of said first and second clock signals to said refresh address generating means.

2. The dynamic random access memory device according to claim 1, further comprising:

means for receiving the externally applied test mode signal; and test mode detecting means responsive to the test mode signal for detecting designation of a test mode;

said selective supply means selectively supplying said second clock signal to said refresh address generating means in response to said test mode detecting means.

3. The dynamic random access memory device according to claim 2, wherein said means for receiving the test mode signal includes means for receiving a state control signal for controlling an operation state of said memory device, said state control signal receiving means receives an externally applied higher voltage having a voltage level exceeding a power supply voltage when the test mode is designated, and said test mode detecting means includes high voltage detecting means connected to said state control signal receiving means and responsive to the externally applied higher voltage for detecting designation of the test mode.

4. The dynamic random access memory device according to claim 1, wherein said selective supply means comprises:

first switching means connected to an output node of said first clock signal generating means; and second switching means connected to an output node of said second clock signal generating means;

said first and second switching means being selectively rendered conductive in response to the externally applied test mode signal.

5. The dynamic random access memory device according to claim 1, wherein said refresh address generating means includes refresh counter means for providing a refresh address signal by counting applied clock signals.

6. The dynamic random access memory device according to claim 1, wherein said designating means includes row decoder means for decoding the refresh address signal applied from said refresh address generating means to select one row of memory cells in said memory cell array.

7. The dynamic random access memory device according to claim 3, wherein said state control signal is one of a row address strobe signal and a column address strobe signal for controlling an operation state of said memory device.

8. The dynamic random access memory device according to claim 1, wherein said second clock signal generating means starts generation of the second clock signal in response to the externally applied test mode signal.

9. A dynamic random access memory device having self-refresh function, comprising:

a memory cell array having a plurality of memory cells arranged in rows and columns;

refresh address generating means responsive to an applied clock signal for generating a refresh address signal;

designating means responsive to the refresh address signal for designating a memory cell to be refreshed in said memory cell array;

first clock signal generating means for generating a first clock signal having a first frequency defining a refresh cycle in a normal self-refresh mode;

means for receiving an externally applied second clock signal having a second frequency higher than said first frequency; and selective supply means responsive to an externally applied test mode signal for selectively supplying one of said first and second clock signals to said refresh address generating means.

10. A dynamic random access memory device having self-refresh function, comprising:

a memory cell array having a plurality of memory cells arranged in rows and columns;

refresh counter means for generating a refresh address signal by counting applied clock signals;

address decoder means for designating a memory cell to be refreshed in said memory cell array by decoding the refresh address signal;

internal clock signal generating means for generating and applying to said refresh counter means internal clock signals having a first frequency defining a refresh cycle in a normal self-refresh mode; and frequency selecting means responsive to an externally applied test mode signal for selectively applying to said refresh counter means said internal clock signals or external clock signals from an externally applied clock signal having a frequency higher than said internal clock signals.

11. A dynamic random access memory device selectively carrying out an externally requested refresh operation and a self-refresh operation, comprising:

a memory cell array having a plurality of memory cells arranged in rows and columns;

first refresh address generating means responsive to an externally applied refresh request signal for generating a refresh address signal;

second refresh address generating means for automatically generating a refresh address signal when said refresh address request signal is not applied; and designating means responsive to the refresh address signals applied from said first and second refresh address generating means for designating a memory cell to be refreshed in said memory cell array;

wherein said second refresh address generating means includes:

first clock signal generating means for generating first clock signals having a first frequency defining a refresh cycle in a normal self-refresh mode, second clock signal generating means for generating second clock signals having a second frequency higher than said first frequency, refresh counter means for counting either of said first and second clock signals applied from said first and second clock signal generating means to generate a refresh address signal, and selective supply means responsive to an externally applied test mode signal for selectively applying one of said first and second clock signals to said refresh counter means.

* * * * *